(12) United States Patent
Fukui et al.

(10) Patent No.: US 7,119,426 B2
(45) Date of Patent: Oct. 10, 2006

(54) SEMICONDUCTOR DEVICE AND MANUFACTURING METHOD OF SAME

(75) Inventors: Yasuki Fukui, Sakai (JP); Koji Miyata, Yao (JP)

(73) Assignee: Sharp Kabushiki Kaisha, Osaka (JP)

( * ) Notice: Subject to any disclaimer, the term of this patent is extended or adjusted under 35 U.S.C. 154(b) by 266 days.

(21) Appl. No.: 10/698,516

(22) Filed: Nov. 3, 2003

(65) Prior Publication Data
US 2005/0253229 A1 Nov. 17, 2005

(30) Foreign Application Priority Data
Nov. 7, 2002 (JP) .............................. 2002-324356

(51) Int. Cl.
H01L 23/02 (2006.01)
H01L 23/34 (2006.01)
H01L 23/48 (2006.01)
H01L 23/52 (2006.01)
H01L 29/40 (2006.01)

(52) U.S. Cl. .................... 257/686; 257/777; 257/723

(58) Field of Classification Search ........ 257/777–778, 257/686, 723, 783; 438/107–110
See application file for complete search history.

(56) References Cited

U.S. PATENT DOCUMENTS

| | | | |
|---|---|---|---|
| 6,100,594 A | | 8/2000 | Fukui et al. |
| 6,229,217 B1 | | 5/2001 | Fukui et al. |
| 6,337,226 B1 | * | 1/2002 | Symons ...................... 257/777 |
| 6,352,879 B1 | | 3/2002 | Fukui et al. |
| 6,353,263 B1 | | 3/2002 | Dotta et al. |

FOREIGN PATENT DOCUMENTS

| | | |
|---|---|---|
| JP | 2000-269407 | 9/2000 |
| JP | 2002-222914 A | 8/2002 |

OTHER PUBLICATIONS

U.S. Appl. No. 10/428,013, filed May 2003, Fukui et al.
Korean Office Action and English translation thereof mailed Oct. 28, 2005 in corresponding Korean application No. 2003-78006.

* cited by examiner

*Primary Examiner*—Cuong Nguyen
(74) *Attorney, Agent, or Firm*—Nixon & Vanderhye P.C.

(57) ABSTRACT

In a semiconductor device in which a second semiconductor chip is layered on a first semiconductor chip mounted on a substrate, a mounting-use bonding layer being formed on a reverse surface of the second semiconductor chip with respect to a circuit formation thereof, the mounting-use bonding layer functions as a bonding agent and as a supporting member for supporting protruded part of the second semiconductor chip, which is protruded from an outer edge of the first semiconductor chip. In this semiconductor device, it is possible to bond the second semiconductor chip and the substrate stably by wire bonding.

7 Claims, 8 Drawing Sheets

SEMICONDUCTOR DEVICE AND MANUFACTURING METHOD OF SAME

This Nonprovisional application claims priority under 35 U.S.C. § 119(a) on Patent Application No. 2002/324356 filed in Japan on Nov. 7, 2002, the entire contents of which are hereby incorporated by reference.

FIELD OF THE INVENTION

The present invention relates to a semiconductor device, especially, a semiconductor device in which a plurality of semiconductor chips are mounted in a package in a layer-built manner (that is, the semiconductor chips are layered in one package), and a manufacturing method of the same.

BACKGROUND OF THE INVENTION

Recent miniaturization and weight reduction of portable devices requires reduction in mounting area for semiconductor devices for use in the portable devices. In view of this, suggested are semiconductor devices of high density, which is achieved by packing a plurality of semiconductor chips are packed in one semiconductor device. Most popular kinds among such semiconductor devices are semiconductor devices in which respective semiconductor chips and a substrate are electrically connected by wire bonding method after the semiconductor chips are layered on the substrate. There are various combinations in chips to be layered because of variety in the chip sizes and methods for mounting the chips on the substrate.

In case of the semiconductor devices in which the semiconductor chips are layered as such, however, there is a case where part (protruded part) of a (upper) semiconductor chip layered on a semiconductor chip mounted on a (lower) circuit substrate is protruded out from the lower semiconductor chip. In this case, the upper semiconductor chip is vibrated by weight applied in wire bonding an electrode terminal provided in the protruded part of the upper semiconductor chip. This makes it difficult to perform the wire bonding stably. This phenomenon more severely affects a semiconductor device having a thinner upper semiconductor chip. If the upper semiconductor chip has too thin thickness, there is a possibility that the upper semiconductor chip may be broken.

In order to solve this problem, there disclosed a semiconductor device which is stabilized by having a spacer or filling a resin or paste in a gap under protruded part of an upper semiconductor chip (for example, Japanese Publication of Unexamined Patent Application "Tokukaihei No. 11-204720" (published on Jul. 30, 1999); corresponding to U.S. Pat. No. 6,100,594, No. 6,352,879, and No. 6,229,217 (Co-pending US Reissue applications)). Moreover, there disclosed a semiconductor device 110, as shown in FIG. 8 (for example, Japanese Publication of Unexamined Patent Application "Tokukai No. 2000-269407, " (published on Sep. 29, 2000)). In the semiconductor device 110 disclosed in this publication, a first semiconductor chip 102 and a second semiconductor chip 103 are layered on a circuit substrate 101 via a bonding layer 104, the first semiconductor chip 102 and the second semiconductor chip 103 being electrically connected with the substrate 101 through a gold wire 106 wherein a supporter 108 is formed in a gap below protruded part of the second semiconductor chip 103, which is on the first semiconductor chip 102, the supporter 108 having the same thickness as the first semiconductor chip 102, which is located under the second semiconductor chip 103. The two semiconductor devices discussed above are characterized in that the supporter is formed in the gap under the protruded part of the upper semiconductor chip, the protruded part being protruded from an outer edge of the lower semiconductor chip, and the supporter having the same size as the protruded part and the same thickness as the lower semiconductor chip.

Moreover, there disclosed a semiconductor device in which a bonding agent used in bonding a lower semiconductor chip with a substrate by flip chip bonding is extruded out and the extruded bonding agent is used a supporter (for example, Japanese Publication of Unexamined Patent Application "Tokukai No. 2000-299431" (published on Oct. 24, 2000); corresponding to U.S. Pat. No. 6,353,263).

In the arts disclosed in Japanese Publication of Unexamined Patent Application "Tokukaihei No. 11-204720" and Japanese Publication of Unexamined Patent Application "Tokukai No. 2000-269407", it is necessary to form, for example as shown in FIG. 8, the supporter 108 that has the same size as the protruded part of the second semiconductor chip, the protruded part being protruded from the outer edge of the first semiconductor chip 102, and to carry out positioning of the supporter 108 thus formed. This process is, however, very difficult and increases a number of members and steps, thereby leading to cost increase.

In the art disclosed in Japanese Publication of Unexamined Patent Application "Tokukai No. 2000-299431", it is a problem that it is difficult to control an amount of the bonding agent to be extruded. That is, for example, in case the amount of the bonding agent to be extruded is insufficient, the protruded part of the upper semiconductor chip cannot be surely supported wholly. Further, this arrangement is applicable only in the case where the lower semiconductor chip is bonded by the flip chip bonding. Thus, this arrangement is poor in versatility.

SUMMARY OF THE INVENTION

The present invention has an object to provide a semiconductor device in which, even if part (protruded part) of an upper semiconductor chip layered on the other is protruded out, an electrode terminal of the protruded part can be easily and surely wire-bonded, the semiconductor device including a plurality of semiconductor chips layered by various mounting methods so as to attain a high density. Further, the present invention relates to a manufacturing method of such semiconductor device.

In order to attain the object, a semiconductor device of the present invention is provided with a plurality of semiconductor chips layered on a circuit substrate, wherein three of the plurality of semiconductor chips are respectively a first semiconductor chip, a second semiconductor chip, and a third semiconductor chip, each of which has a circuit formation surface (on which a circuit is formed) and a reverse surface with respect to the circuit formation surface, the first semiconductor chip being mounted on the circuit substrate or the third semiconductor chip in such a manner that the reverse surface of the first semiconductor chip faces the circuit substrate, the second semiconductor chip (i) being mounted on the first semiconductor chip in such a manner that the reverse surface of the second semiconductor chip faces the circuit formation surface of the first semiconductor chip, and (ii) having protruded part formed by protruding at least one outer edge of the second semiconductor chip from an outer edge of the first semiconductor chip, the first semiconductor chip and the second semiconductor chip being wire-boned with the circuit substrate; the semiconductor device including a mounting-use bonding layer on the reverse surface of the second semiconductor chip, and the mounting-use bonding layer functioning as a bonding agent for mounting the second semiconductor chip on the first semiconductor chip, and filling a gap between (i) the circuit substrate or a third semiconductor chip, and (ii) the protruded part of second semiconductor chip.

The semiconductor device of the present invention is so arranged that the second semiconductor chip is mounted (layered) on the first semiconductor device that is mounted on the circuit substrate or the third semiconductor chip in such a manner that the reverse surface of the first semiconductor chip with respect to the circuit formation surface thereof faces a wiring surface of the circuit substrate (that is, so as to be so-called face-up (the first semiconductor chip is face-up type)).

With this arrangement, the mounting-use bonding layer provided on the reverse surface of the second semiconductor chip (i) functions as a bonding agent in mounting the second semiconductor chip on the first semiconductor chip, and (ii) fills the gap below the protruded part of the second semiconductor chip, the protruded part being protruded from the outer edge of the first semiconductor chip. This allows the mounting-use bonding layer to function as a member for supporting the protruded part of the second semiconductor chip.

In other words, the mounting-use bonding layer functions as the supporting member for supporting the protruded part of the second semiconductor chip, in case where the outer edge of the second semiconductor chip is protruded (projected out) from the outer edge of the first semiconductor chip, the first semiconductor chip and the second semiconductor chip being layered on the circuit substrate or the third semiconductor chip. This prevents the second semiconductor chip from being vibrated by a weight applied during wire bonding of the protruded part of the second semiconductor chip. This attains stable wire bonding to bond the circuit substrate with an electrode terminal provided on the protruded part of the second semiconductor chip. Thus, it becomes possible to provide, by good wire bonding, a semiconductor device of a high quality.

Further, no additional member or supporting member is required in the semiconductor device, in which the mounting-use bonding layer functions as the bonding agent in mounting the second semiconductor chip and as the supporting member. Because of this, it is possible to attain cost reduction.

Moreover, in the semiconductor device, it is possible to set the amount of the mounting-use bonding layer in advance. That is, in the semiconductor device, it is possible to easily control the amount (thickness) of the mounting-use bonding layer so that the protruded part of the second semiconductor chip can be surely supported. This can prevent such a trouble that the protruded part of the semiconductor chip can not be sufficiently supported due to insufficient amount of the bonding agent.

Moreover, a semiconductor device of the present invention is provided with a plurality of semiconductor chips layered on a circuit substrate, wherein two of the plurality of semiconductor chips are respectively a first semiconductor chip and a second semiconductor chip, each of which has a circuit formation surface (on which a circuit is formed) and a reverse surface with respect to the circuit formation surface, the first semiconductor chip being flip-chip connected on the circuit substrate in such a manner that the circuit formation surface of the first semiconductor chip faces the circuit substrate, the second semiconductor chip (i) being mounted on the first semiconductor chip in such a manner that the reverse surface of the second semiconductor chip faces the circuit formation surface of the first semiconductor chip, and (ii) having protruded part formed by protruding at least one outer edge of the second semiconductor chip from an outer edge of the first semiconductor chip, the second semiconductor chip being wire-boned with the circuit substrate; the semiconductor device comprising a mounting-use bonding layer on the reverse surface of the second semiconductor chip, and the mounting-use bonding layer (a) functioning as a bonding agent for mounting the second semiconductor chip on the first semiconductor chip, and (b) filling a gap between (A) the circuit substrate, and (B) the protruded part of second semiconductor chip.

The semiconductor device of the present invention is so arranged that the second semiconductor chip is mounted (layered) on the first semiconductor device that is connected and bonded on the circuit substrate by flip-chip bonding in such a manner that the reverse surface of the first semiconductor chip with respect to the circuit formation surface thereof faces a wiring surface of the circuit substrate (that is, so as to be so-called face-down (the first semiconductor chip is face-down type)).

With this arrangement, the mounting-use bonding layer provided on the reverse surface of the second semiconductor chip (i) functions as a bonding agent in mounting the second semiconductor chip on the first semiconductor chip, and (ii) fills the gap below the protruded part of the second semiconductor chip, the protruded part being protruded from the outer edge of the first semiconductor chip. This allows the mounting-use bonding layer to function as a member for supporting the protruded part of the second semiconductor chip.

In other words, the mounting-use bonding layer functions as the supporting member for supporting the protruded part of the second semiconductor chip, in case where the outer edge of the second semiconductor chip is protruded (projected out) from the outer edge of the first semiconductor chip, the first semiconductor chip and the second semiconductor chip being layered on the circuit substrate or the third semiconductor chip. This prevents the second semiconductor chip from being vibrated by a weight applied during wire bonding of the protruded part of the second semiconductor chip. This attains stable wire bonding to bond the circuit substrate with an electrode terminal provided on the protruded part of the second semiconductor chip. Thus, it becomes possible to provide, by good wire bonding, a semiconductor device of a high quality.

Further, no additional member or supporting member is required in the semiconductor device, in which the mounting-use bonding layer functions as the bonding agent in mounting the second semiconductor chip and as the supporting member. Because of this, it is possible to attain cost reduction.

Moreover, in the semiconductor device, it is possible to set the amount of the mounting-use bonding layer in advance. That is, in the semiconductor device, it is possible to easily control the amount (thickness) of the mounting-use bonding layer so that the protruded part of the second semiconductor chip can be surely supported. This can prevent such a trouble that the protruded part of the semiconductor chip can not be sufficiently supported due to insufficient amount of the bonding agent.

Furthermore, a manufacturing method of the present invention for manufacturing a semiconductor device including a plurality of semiconductor chips layered on a circuit substrate, includes the steps of: mounting a first semiconductor chip, which is one of the plurality of semiconductor chips, (i) on the circuit substrate in such a manner that the circuit substrate faces a reverse surface of the first semiconductor chip with respect to a circuit formation surface thereof, or (ii) on a third semiconductor chip, which is another one of the plurality of semiconductor chips; forming a mounting-use bonding layer on a reverse surface of a wafer and dicing the wafer into chips, each of which is a second semiconductor chip on which a mounting-use bonding layer is provided, the second semiconductor chip being still another one of the plurality of the semiconductor chips; mounting the second semiconductor chip on the first semiconductor chip in such a manner that (a) a circuit formation surface of the first semiconductor chip faces a reverse surface of the second semiconductor chip with respect to a circuit formation surface thereof, (b) at least one outer edge of the second semiconductor chip is protruded from an outer edge of the first semiconductor chip so as to form protruded part of the second semiconductor chip, and (c) a supporting member for supporting the protruded part is formed from the mounting-use bonding layer; and wire-bonding the circuit substrate with the first semiconductor chip and the second semiconductor chip.

With this arrangement, it is possible to easily manufacture a semiconductor device in which the second semiconductor chip is layered on the first semiconductor chip mounted on the circuit substrate or the third semiconductor chip in the face-up manner, wherein the mounting-use bonding layer provided on the reverse surface of the second semiconductor chip functions as a bonding agent in mounting the second semiconductor chip on the first semiconductor chip and fills the gap between the protruded part of the second semiconductor chip and the circuit substrate or the third semiconductor chip so as to function as a member for supporting the protruded part of the second semiconductor chip.

In other words, the mounting-use bonding layer functions as the supporting member for supporting the protruded part of the second semiconductor chip, in case where the outer edge of the second semiconductor chip is protruded (projected out) from the outer edge of the first semiconductor chip, the first semiconductor chip and the second semiconductor chip being layered on the circuit substrate or the third semiconductor chip. This prevents the second semiconductor chip from being vibrated by a weight applied during wire bonding of the protruded part of the second semiconductor chip. This attains stable wire bonding to bond the circuit substrate with an electrode terminal provided on the protruded part of the second semiconductor chip. Thus, it becomes possible to provide, by good wire bonding, a semiconductor device of a high quality.

Further, in the manufacturing method of the semiconductor device, the mounting-use bonding layer functions as the bonding agent in mounting the second semiconductor chip and as the supporting member. Thus, it is not necessary to additionally have an extra member or extra supporting member. Because of this, it is possible to attain cost reduction.

Moreover, the second semiconductor chip is prepared by forming the mounting-use bonding layer on the wafer, and dicing the wafer into chips, each of which is the second semiconductor chip. In this way, it is possible to attain, with large batch scale, efficient production of the second semiconductor chip on which the mounting-use bonding layer having the same surface area (size) as the reverse surface of the second semiconductor chip with respect to the circuit formation surface is formed. Thus, it is possible to attain cost reduction in production of the second semiconductor chip having such mounting-use bonding layer.

Moreover, in the manufacturing method of the semiconductor device, it is possible to set the amount of the mounting-use bonding layer in advance. That is, in the semiconductor device, it is possible to easily control the amount (thickness) of the mounting-use bonding layer so that the protruded part of the second semiconductor chip can be surely supported. This can prevent such a trouble that the protruded part of the semiconductor chip can not be sufficiently supported due to insufficient amount of the bonding agent.

Moreover, a manufacturing method of the present invention for a semiconductor device including a plurality of semiconductor chips layered on a circuit substrate, includes the steps of: flip-chip bonding a first semiconductor chip, which is one of the plurality of semiconductor chips, on the circuit substrate in such a manner that a circuit formation surface of the first semiconductor chip faces the circuit substrate; forming a mounting-use bonding layer on a reverse surface of a wafer and dicing the wafer into chips, each of which is a second semiconductor chip on which a mounting-use bonding layer is provided, the second semiconductor chip being still another one of the plurality of the semiconductor chips; mounting the second semiconductor chip on the first semiconductor chip in such a manner that (i) a reverse surface of the first semiconductor chip with respect to the circuit formation surface thereof faces a reverse surface of the second semiconductor chip with respect to a circuit formation surface thereof, and (ii) at least one outer edge of the second semiconductor chip is protruded from an outer edge of the first semiconductor chip so as to form protruded part of the second semiconductor chip, and (iii) a supporting member for supporting the protruded part is formed from the mounting-use bonding layer; and wire-bonding the circuit substrate with the first semiconductor chip and the second semiconductor chip.

With this arrangement, it is possible to easily manufacture a semiconductor device in which the second semiconductor chip is layered on the first semiconductor chip mounted on the circuit substrate in the face-down manner, wherein the mounting-use bonding layer provided on the reverse surface of the second semiconductor chip functions as a bonding agent in mounting the second semiconductor chip on the first semiconductor chip and fills the gap between the protruded part of the second semiconductor chip and the circuit substrate so as to function as a member (supporting member) for supporting the protruded part of the second semiconductor chip.

In other words, the mounting-use bonding layer functions as the supporting member for supporting the protruded part of the second semiconductor chip, in case where the outer edge of the second semiconductor chip is protruded (projected out) from the outer edge of the first semiconductor chip, the first semiconductor chip and the second semiconductor chip being layered on the circuit substrate. This prevents the second semiconductor chip from being vibrated by a weight applied during wire bonding of the protruded part of the second semiconductor chip. This attains stable wire bonding to bond the circuit substrate with an electrode terminal provided on the protruded part of the second semiconductor chip. Thus, it becomes possible to provide, by good wire bonding, a semiconductor device of a high quality.

Further, in the manufacturing method of the semiconductor device, the mounting-use bonding layer functions as the bonding agent in mounting the second semiconductor chip and as the supporting member. Thus, it is not necessary to additionally have an extra member or extra supporting member. Because of this, it is possible to attain cost reduction.

Moreover, the second semiconductor chip is prepared by forming the mounting-use bonding layer on the wafer, and dicing the wafer into chips, each of which is the second semiconductor chip. In this way, it is possible to attain, with large batch scale, efficient production of the second semiconductor chip on which the mounting-use bonding layer having the same surface area (size) as the re with respect to Figure verse surface of the second semiconductor chip with respect to the circuit formation surface is formed. Thus, it is possible to attain cost reduction in production of the second semiconductor chip having such mounting-use bonding layer.

Moreover, in the manufacturing method of the semiconductor device, it is possible to set the amount of the mounting-use bonding layer in advance. That is, in the semiconductor device, it is possible to easily control the amount (thickness) of the mounting-use bonding layer so that the protruded part of the second semiconductor chip can be surely supported. This can prevent such a trouble that the protruded part of the semiconductor chip can not be sufficiently supported due to insufficient amount of the bonding agent.

For a fuller understanding of the nature and advantages of the invention, reference should be made to the ensuing detailed description taken in conjunction with the accompanying drawings.

BRIEF DESCRIPTION OF THE DRAWING

FIG. 8(a) is a perspective view of a conventional semiconductor device, while FIG. 8(b) is a cross-sectional view of the semiconductor device shown in FIG. 8(a).

DESCRIPTION OF THE EMBODIMENTS

[First Embodiment]

Figure 1:
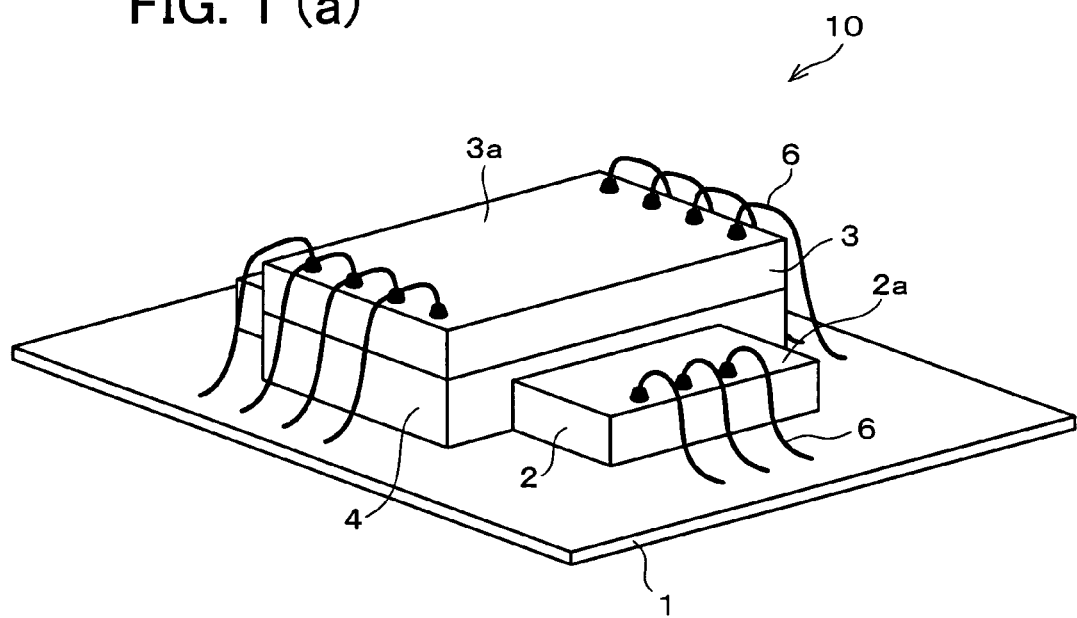
FIG. 1(a) is a perspective view illustrating a semiconductor device of an embodiment of the present invention.
FIG. 1(b) is a cross-sectional view of the semiconductor device shown in FIG. 1(a).
Figure 1:
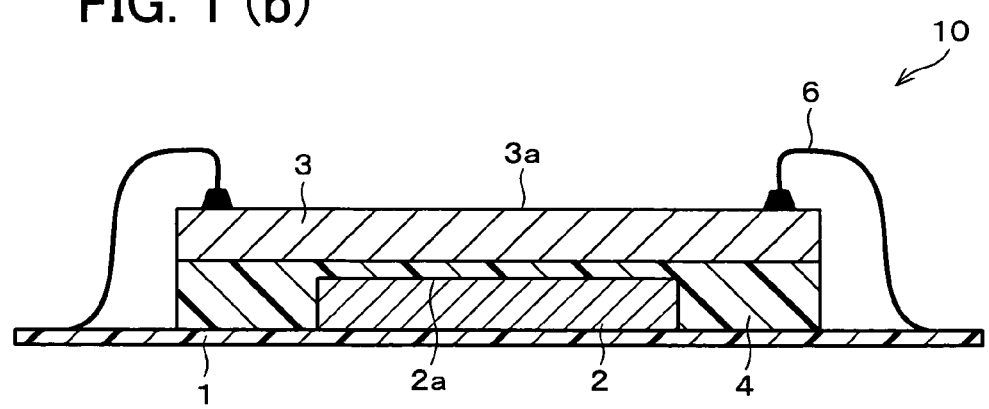
Figure 2:
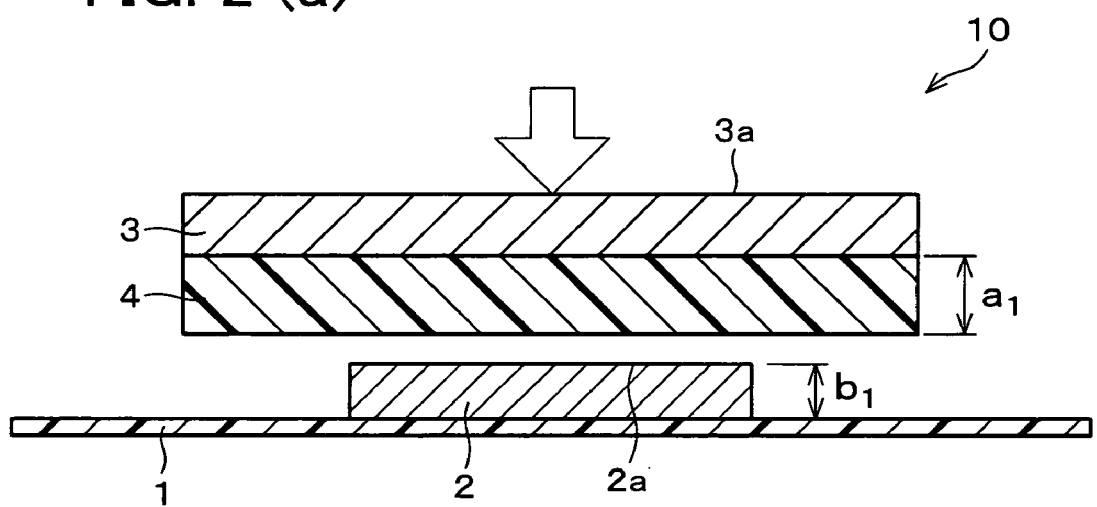
FIG. 2(a) is a cross-sectional view of the semiconductor device of the embodiment, illustrating a state before mounting a second semiconductor chip in case where a mounting-use bonding layer has a sufficient thickness.
FIG. 2(b) is a cross-sectional view illustrates a state after mounting the second semiconductor chip.
Figure 2:
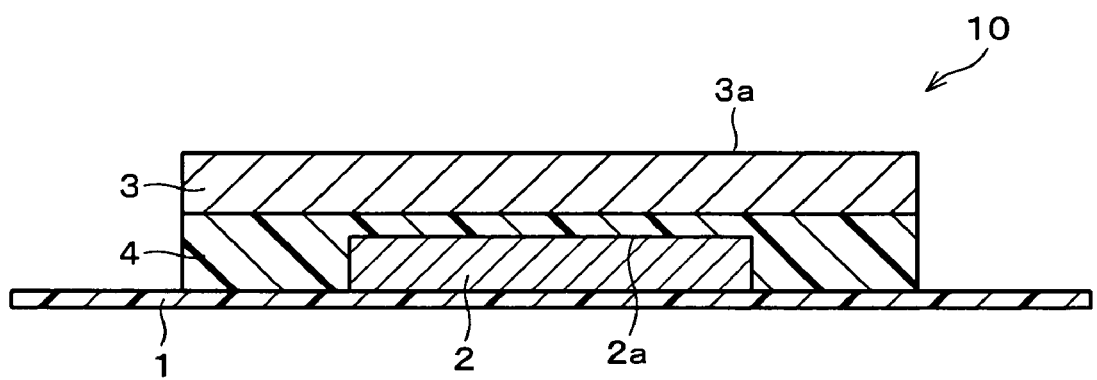
Figure 3:
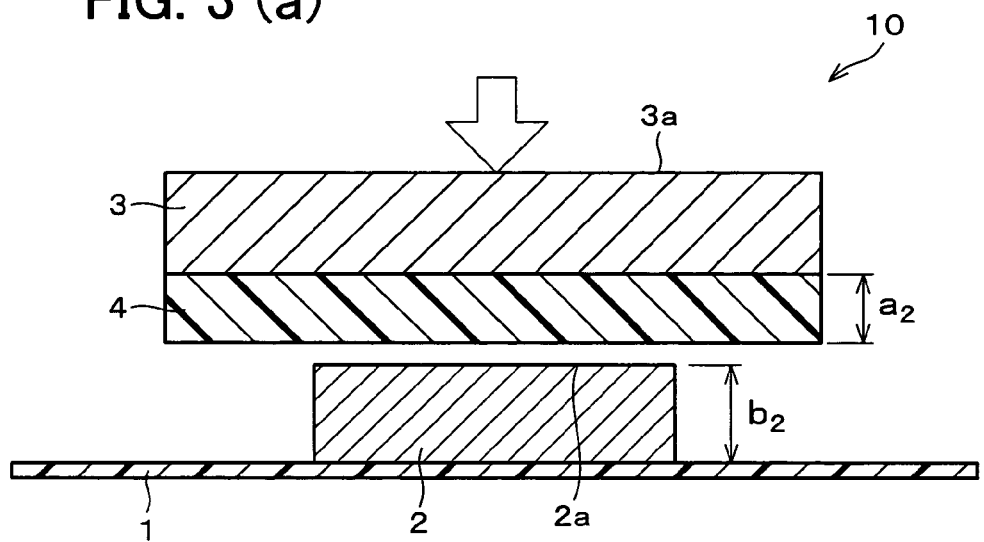
FIG. 3(a) is a cross-sectional view of the semiconductor device of the embodiment before mounting a second semiconductor chip in case where a mounting-use bonding layer has an insufficient thickness.
FIG. 3(b) is a cross-sectional view illustrates the semiconductor device after mounting the second semiconductor chip.
Figure 3:
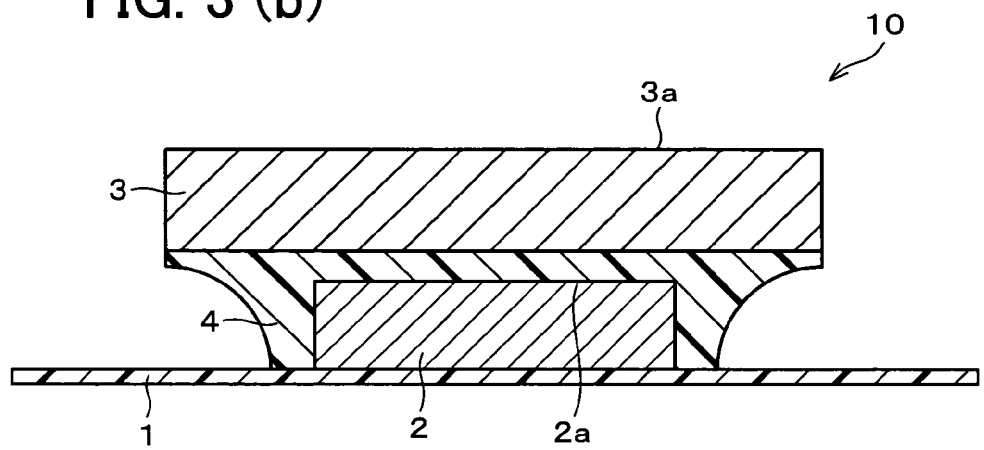

An embodiment of a semiconductor device of the present invention is described below referring to FIGS. 1 to 3. It should be noted that the present invention is not limited to this.

FIGS. 1(a) and 1(b) explain how the semiconductor device of the present embodiment is arranged.

A semiconductor device 10 of the present embodiment is provided with a substrate 1, a first semiconductor chip 2, a second semiconductor chip 3, a mounting-use bonding layer 4, and gold wires (wires) 6.

For the substrate 1, it is only required that the substrate 1 be a circuit substrate having at least one surface (wiring surface) on which circuit wiring made of a conductive material such as copper or the like is formed. The substrate 1 is not particularly limited and may be various substrates such as lead frame made of metal, organic substrates made of BT resin, polyimide, or the like.

The first semiconductor chip 2 and the second semiconductor chip 3 respectively have circuit formation surfaces 2a and 3a on each of which a circuit is formed. The semiconductor chips 2 and 3 are not particularly limited and may be any kind of semiconductor chips.

The first semiconductor chip 2 is so mounted on the substrate 1 that a reverse surface of the first semiconductor chip 2 with respect to the circuit formation surface 2a faces a wiring surface of the substrate 1. That is, the first conductor chip 2 is so mounted on the substrate 1 as to be so-called face-up (in the face-up manner).

Moreover, the second semiconductor chip 3 is so mounted on the first semiconductor chip 2 that the circuit formation surface 2a faces a reverse surface of the second semiconductor chip 3 with respect to the circuit formation surface 3a. Moreover, the second semiconductor chip 3 is so mounted (layered) on the first semiconductor chip 2 that an outer edge of the second semiconductor chip 3 is protruded from an outer edge of the first semiconductor chip 2.

Moreover, electrode terminals of the first semiconductor chip 2 and the second semiconductor chip 3 are electrically connected with the substrate 1 via the gold wires 6. Note that the electrode terminal of the second semiconductor chip 3 is located in protruded part of the second semiconductor chip 3, the protruded part being protruded from the outer edge of the first semiconductor chip 2 (hereinafter, the protruded part is just referred to as the protruded part of the second semiconductor chip 3).

The gold wires 6 are not particularly limited and may be wires made of thin metal lines for electrically connecting the electrode terminal of the first semiconductor chip 2 or the second semiconductor chip 3 with the wire of the substrate 1.

The mounting-use bonding layer 4 is provided on the reverse surface the second semiconductor chip 3 with respect to the circuit formation surface 3a. The mounting-use bonding layer 4 functions as a bonding agent for fixedly bonding the second semiconductor chip 3 on the first semiconductor chip 2 in mounting the second semiconductor chip 3 on the first semiconductor chip 2. Further, the mounting-use bonding layer 4 fills a gap between the substrate 1 and the protruded part of the second semiconductor chip 3 so that the mounting-use bonding layer 4 functions as a supporting member for supporting the protruded part of the second semiconductor chip 3. In other words, the gap between the substrate 1 and the protruded part of the second semiconductor chip 3 is filled up with the mounting-use bonding layer 4 as a mounting-use bonding agent.

It is preferable that the mounting-use bonding layer 4 is made of a bonding resin that is melted into a liquid state, for example by heating and the like, in mounting the second semiconductor chip 3 on the first semiconductor chip 2. Especially, it is preferable that the mounting-use bonding layer 4 is made of a thermosetting resin that is in a solid state at ordinary temperatures, is melted into a liquid state by heat, and is completely solidified by later heat treatment. Specifically, among such thermosetting resins, an epoxy resin is preferable. Moreover, it may be so arranged that the mounting-use bonding layer 4 is made of a liquid resin. Note that the mounting-use bonding layer 4 may be made of one of the resins solely or may be made of more than one of the resins in combination. Further, the mounting-use bonding layer 4 may contain a component other than the those resins.

Moreover, as to that surface upper surface) of the mounting-use bonding layer 4 which is in contact with the second semiconductor chip 3, it is preferable that the upper surface has a shape (size) substantially equal to a shape (size) of the reverse surface of the second semiconductor chip 3. Moreover, as to that part supporting part) of the mounting-use bonding layer 4 which supports the protruded part of the second semiconductor chip 3 and is in contact with the second semiconductor chip 3, it is preferable that the supporting part has a shape (size) substantially equal to the shape (size) of the reverse surface of the circuit formation surface of the protruded part of the second semiconductor chip 3.

One of manufacturing methods for the second semiconductor chip 3 is a method in which, when the second semiconductor chip 3 is still a wafer, the mounting-use bonding layer 4 is formed on a reverse surface of the wafer and then the wafer is divided into chips by dicing or the like method, each of chips being the second semiconductor chip 3. With this method, it is easy to form the mounting-use bonding layer 4 in a size (shape) equal to the chip size of the second semiconductor chip 3. Therefore, it is possible to manufacture, at a low cost, the second semiconductor chip 3 on which the mounting-use bonding layer 4 is formed. Moreover, as another method of forming the mounting-use bonding layer 4 on the reverse surface of the second semiconductor chip 3 with respect to the circuit formation surface 3a, it is possible to adopt, for example, a method in which a liquid resin is applied to a certain thickness and transcribed on the reverse surface of the second semiconductor chip 3 with respect to the circuit formation surface 3a, by a well-known screen printing or the like method.

In the following, a manufacturing method of the semiconductor device 10 is explained. FIGS. 2(a) and 2(b) illustrate the semiconductor device 10 of the present embodiment before and after mounting the second semiconductor chip 3 on the substrate 1, where the mounting-use bonding layer 4 has a sufficient thickness.

As shown in FIGS. 2(a) and 2(b), the semiconductor chip 3, in which the mounting-use bonding layer 4 is formed on the reverse surface thereof with respect to the circuit formation surface 3a, is mounted on the first semiconductor chip 2 mounted on the substrate 1 in such a manner that the mounting-use bonding layer 4 faces the circuit formation surface 2a. Here, if the mounting-use bonding layer 4 is made of a thermosetting resin, it is possible to melt the mounting-use bonding layer 4 into the liquid state in mounting the second semiconductor chip 3, for example, by heating a lower portion of the substrate 1 by using a heating apparatus such as a heater. By doing this, the mounting-use bonding layer 4 bonds the second semiconductor chip 3 with the first semiconductor chip 2 and fills the gap between the substrate 1 and the protruded part of the second semiconductor chip 3, thereby bonding the protruded part of the second semiconductor chip 3 with the substrate 1, and forming the supporting member for supporting the protruded part of the second semiconductor chip 3.

Note that, it is possible to arbitrarily adjust and set conditions for the formation of the supporting member, for example, heating conditions (temperature, duration of heating, and the like) in mounting the second semiconductor chip 3, and weight-applying conditions (amount of weight to be applied and duration of weight application, and the like), and the like.

Moreover, the electrode terminals of the first semiconductor chip 2 or the second semiconductor chip 3 may be wire-bonded with the substrate 1 by any conventional well-known methods, and there is no particular limitation in how to carry out the wire bonding.

Moreover, the thickness (amount) of the mounting-use bonding layer 4 is not particularly limited, provided that the thickness (amount) ensures the bonding of the first semiconductor chip 2 with the second semiconductor chip 3 and causes the mounting-use bonding layer 4 to fill in the gap between the substrate 1 and the protruded part of the second semiconductor chip 3 so that the mounting-use bonding layer 4 can function as the supporting member. That is, it is possible to control the thickness (amount) of the mounting-use bonding layer 4 so that the protruded part of the second semiconductor chip 3 can be surely supported.

For example, if the mounting-use bonding layer 4 has a thickness $a_1$ equal to or thicker than a thickness $b_1$ of the first semiconductor chip 2 as shown in FIG. 2(a), it is possible to surely form the supporting member in the gap between the substrate 1 and the protruded part of the second semiconductor chip 3 in mounting the second semiconductor chip 3, as shown in FIG. 2(b).

On the other hand, if the mounting-use bonding layer 4 has a thickness $a_2$ thinner than a thickness $b_2$ of the first semiconductor chip 2 as shown in FIG. 3(a), it is difficult to fully form the supporting member in the gap between the substrate 1 and the protruded part of the second semiconductor 3 by mounting the second substrate chip 3, as shown in FIG. 3(b). However, even if the supporting member is not fully formed as shown in FIG. 3(b), in view of strength of materials, the supporting member having such a structure shown in FIG. 3(b) can significantly alleviate a damage given by the weight applied on the second semiconductor chip 3 in performing the wire bonding. This allows the supporting member to function sufficiently.

The semiconductor device 10 of the present embodiment is, as described above, a semiconductor device in which the second semiconductor chip 3 is layered on the first semiconductor chip 2 mounted on the substrate 1 in the so-called face-up type method. Therefore, the above arrangement allows the mounting-use bonding layer 4 to function as the bonding agent and as the supporting member for supporting the protruded part of the second semiconductor chip 3, even if the first semiconductor chip 2 and the second semiconductor chip 3 are so mounted on the substrate 1 that the outer edge of the second semiconductor chip 3 is protruded from the first semiconductor chip 2. With this arrangement, it is possible to prevent the vibration of the second semiconductor chip 3 in performing the wire bonding of the second semiconductor chip, the vibration being caused by the weight applied in performing the wire bonding. Therefore, it is possible to wire-bond the electrode terminal of the second semiconductor chip 3 with the substrate 1 surely and stably. With this arrangement, it is possible to provide, by good wire bonding, a semiconductor device of a high quality.

Further, in the semiconductor device 10, the mounting-use bonding layer 4 functions as the bonding agent for the second semiconductor chip 3 and as the supporting member. Thus, it is unnecessary to additionally have a step for extra member or extra supporting member. This can reduces the cost.

Moreover, in the semiconductor device 10, it is possible to set the amount of the mounting-use bonding layer 4 in advance. That is, in the semiconductor device 10, it is possible to easily control the amount of the mounting-use bonding layer 4 so that the protruded part of the second semiconductor chip 3 can be surely supported. This can prevent such a trouble that the protruded part of the semiconductor chip 3 can not be sufficiently supported due to insufficient amount of the bonding agent.

Note that the semiconductor device 10 of the present embodiment may be a resin-sealed semiconductor device in which the first semiconductor chip 2, the second semiconductor chip 3, and the gold wire 6 provided on the substrate 1 are sealed with resin after the electrode terminals of the first semiconductor chip 2 and the second semiconductor chip 3 are wire-bonded with the substrate 1. With this arrangement, it is possible to easily manufacture a resin-sealed semiconductor device having the above advantages. The resin for sealing is not particularly limited and may be used a conventionally well-known resin. Specifically, it is possible to use a thermosetting resin (such as epoxy resin), and the like.

[Second Embodiment]

Figure 4:
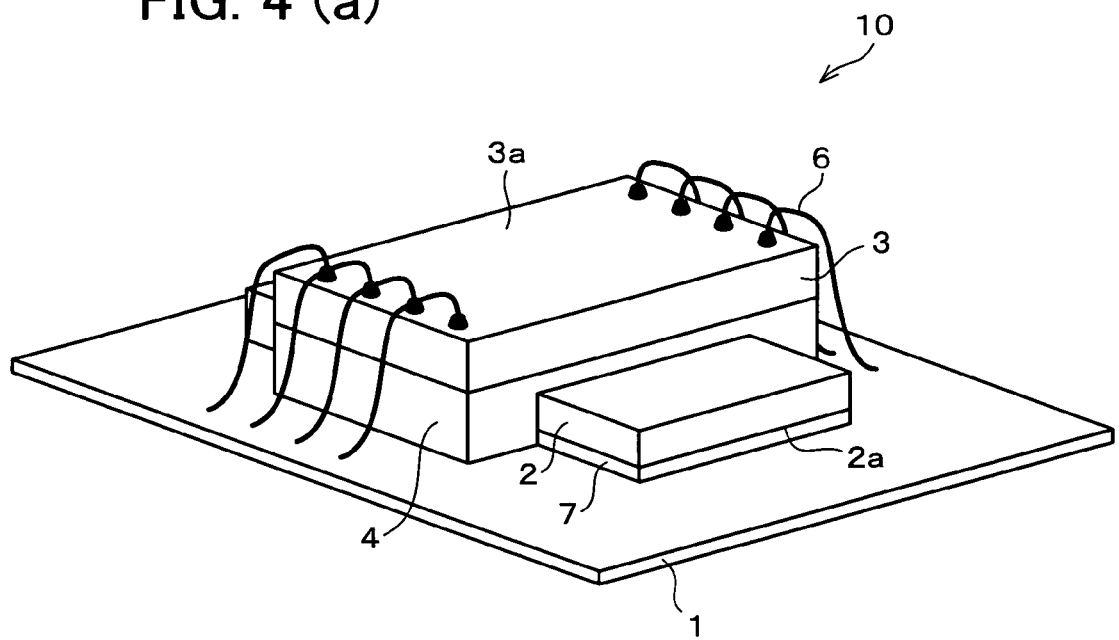
FIG. 4(a) is a perspective view illustrating a semiconductor device of another embodiment of the present invention, the semiconductor device including semiconductor chips mounted by flip chip bonding.
FIG. 4(b) is a cross-sectional view of the semiconductor device shown in FIG. 4(a).
Figure 4:
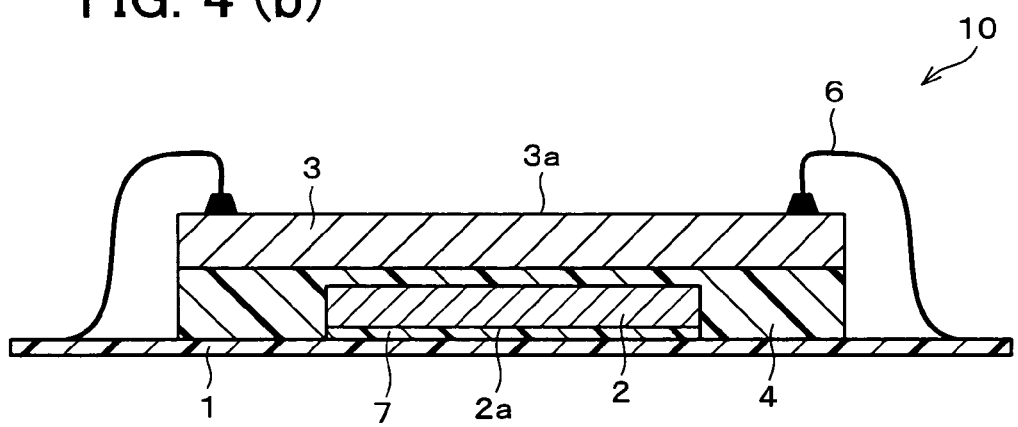

Described blow is another embodiment of a semiconductor device of the present invention, with reference to FIG. 4. For the sake of easy explanation, members having the same functions as the members described in the first embodiment are labeled in the same manner and their explanation is omitted here. In the present embodiment, a difference between the present embodiment and the first embodiment is explained.

FIGS. 4(a) and 4(b) illustrate a semiconductor device 10 in which the first semiconductor chip 2 is connected and bonded with a substrate 1 by flip chip bonding. As shown in FIGS. 4(a) and 4(b), the semiconductor device 10 of the present embodiment is provided with the substrate 1, a first semiconductor chip 2, a second semiconductor chip 3, a mounting-use bonding layer 4, gold wires (wires) 6, and a bonding layer 7.

In the present embodiment, the first semiconductor chip 2 is so connected and bonded, by flip chip bonding, that a circuit formation surface 2a of the first semiconductor chip 2 faces a wiring surface of the substrate 1. That is, the first semiconductor chip 2 is so mounted on the substrate 1 as to be face-down (in the face-down manner), in the present embodiment.

The second semiconductor chip 3 is so mounted on the first semiconductor chip 2 that a reverse surface of the first semiconductor chip 2 with respect to the circuit formation surface 2a faces a reverse surface of the second semiconductor chip 3 with respect to a circuit formation surface 3a. Moreover, the second semiconductor chip 3 is so mounted (layered) on the first semiconductor chip 2 that an outer edge of the second semiconductor chip 3 is protruded from an outer edge of the first semiconductor chip 2. Note that the second semiconductor chip 3 is electrically connected with the substrate 1 via the gold wires 6.

The bonding layer 7 is not particularly limited, provided that the bonding layer 7 connects and bonds the first semiconductor chip 2 with the substrate 1 by flip chip bonding. Specifically, the bonding layer 7 may be made of a paste-type bonding agent, sheet-like shaped bonding agent, an anisotropic conductive film, anisotropic conductive paste, and the like. Note that the bonding layer 7 may be made of those solely or in combination.

With this arrangement, the same advantage as the first embodiment can be attained in the semiconductor device in which the second semiconductor chip 3 is layered on the first semiconductor chip 2 that is so mounted as to be so-called face-down. That is, the mounting-use bonding layer 4 functions as the bonding agent in mounting the second semiconductor chip 3 and as a supporting member for supporting protruded part of the second semiconductor chip 3. Because of this, it is possible to wire bonding an electrode terminal of the second semiconductor chip 3 with the substrate 1 stably. Moreover, because this does not requires an additional member or step, it is possible to attain beneficial effects such as cost reduction. This makes it possible to provide, by good wire bonding, a semiconductor device of a high quality.

[Third Embodiment]

Described below is still another embodiment of a semiconductor device of the present invention, referring to FIGS. 5(a), 5(b), 6(a) and 6(b). For the sake of easy explanation, members having the same functions as the members described in the first and second embodiments are labeled in the same manner and their explanation is omitted here. In the present embodiment, a difference from the first and second embodiments is explained.

Figure 5:
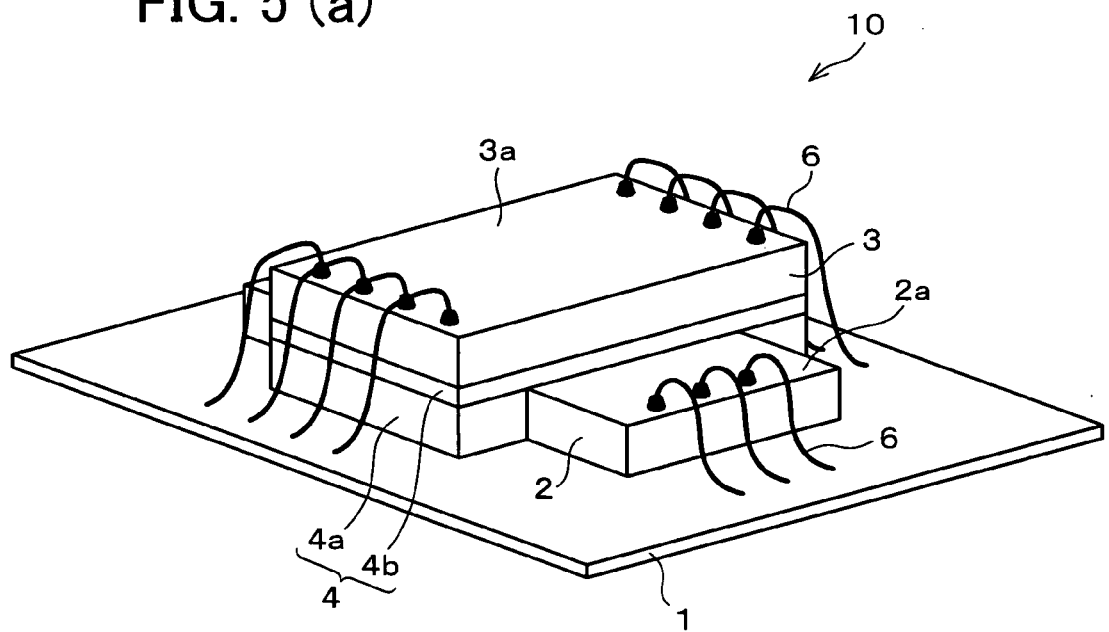
FIG. 5(a) is a perspective view illustrating a semiconductor device of still another embodiment of the present invention, the semiconductor device having a mounting-use bonding layer having two-layered structure.
FIG. 5(b) is a cross-sectional view of the semiconductor device shown in FIG. 5(a).
Figure 5:
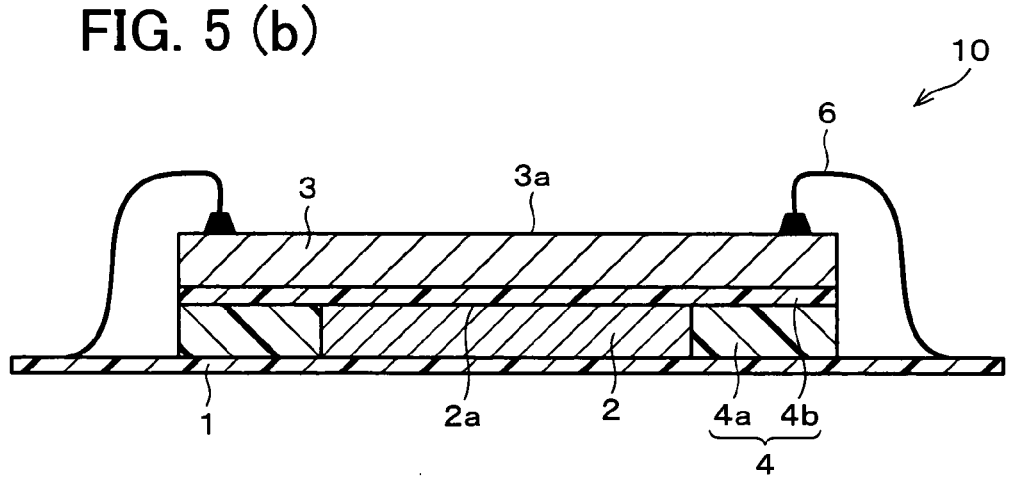

FIGS. 5(a) and 5(b) illustrate a semiconductor device 10 having a two-layered mounting-use bonding layer 4. As shown in FIGS. 5(a) and 5(b), the semiconductor device 10 of the present embodiment is provided with a substrate 1, a first semiconductor chip 2, a second semiconductor chip 3, the mounting-use bonding layer 4, and gold wires (wires) 6.

The mounting-use bonding layer 4 has a two-layered structure including a mounting-use bonding layers 4a and 4b. The mounting-use bonding layer 4 is provided on a reverse surface of the second semiconductor chip 3 with respect to the circuit formation surface 3a. The mounting-use bonding layer 4a is on a first semiconductor chip 2 side (that is associated with the first semiconductor chip 2), while the mounting-use bonding layer 4b is on a substrate 1 side (that is associated with the substrate 1). Even though the two-layered mounting-use bonding layer 4 is used in the present embodiment, the mounting-use bonding layer 4 is not limited to the two-layered structure and may have more than two layers so as to be three layered or more.

The mounting-use bonding layer 4b associated with the second semiconductor 3 of the mounting-use bonding layer 4 is less meltable into a liquid state, compared with the mounting-use bonding layer 4a associated with the substrate 1. More specifically, for example, it may be so arranged that a melting temperature of the mounting-use bonding layer 4b, at which the mounting-use bonding layer 4b melts into a liquid state, is set to be higher than that of the mounting-use bonding layer 4a.

Moreover, a thickness of the mounting-use bonding layer 4a is not particularly limited, provided that the thickness is enough to allow the mounting-use bonding layer 4a to fill a gap between the substrate 1 and the protruded part of the second semiconductor chip 3 so that the mounting-use bonding layer 4a functions as a supporting member. Moreover, a thickness of the mounting-use bonding layer 4b is not particularly limited, provided that the thickness is enough to allow the mounting-use bonding layer 4b to surely bond the first semiconductor chip 2 with the second semiconductor chip 3.

Figure 6:
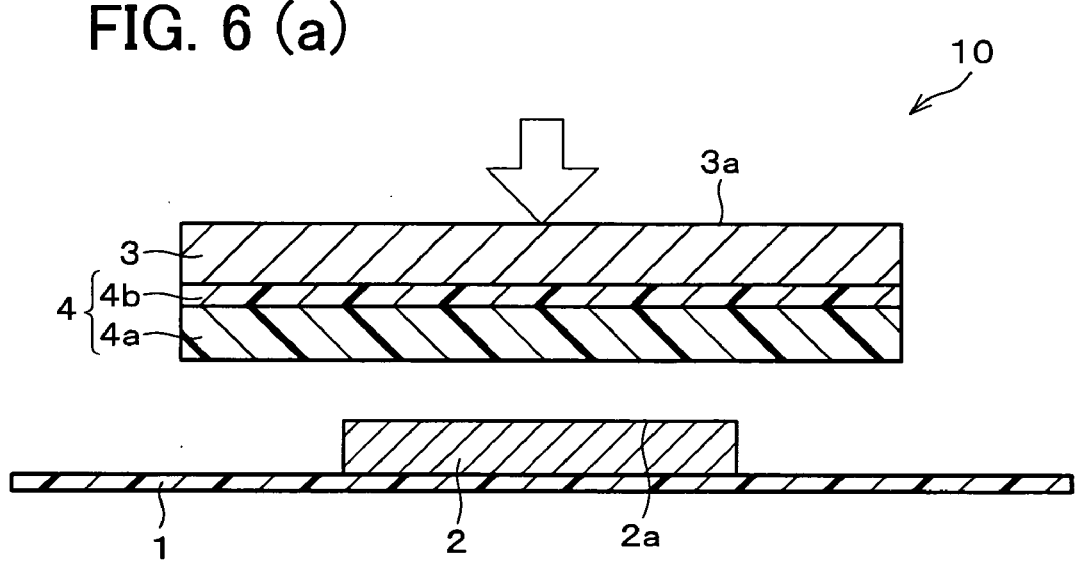
FIG. 6(a) is a cross-sectional view of the semiconductor device a semiconductor device of still another embodiment having the mounting-use bonding layer having two-layered structure, before mounting a second semiconductor chip.
FIG. 6(b) is a cross-sectional view of the semiconductor device after mounting the second semiconductor chip.
Figure 6:
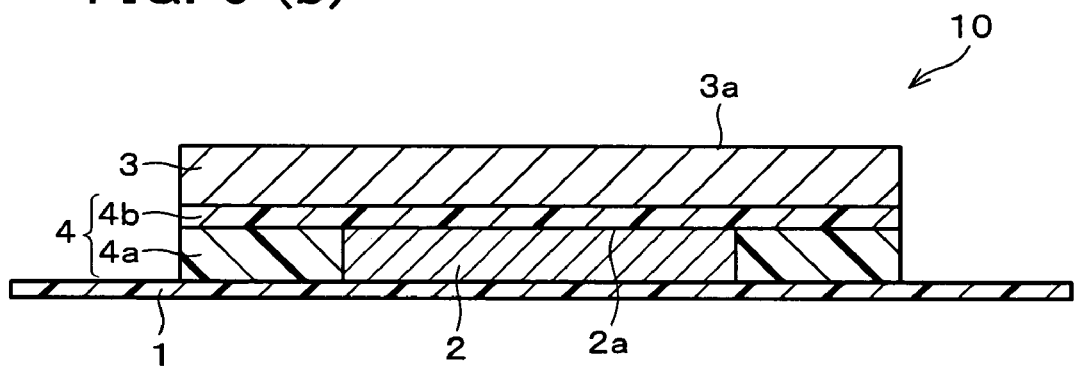

FIGS. 6(a) and 6(b) illustrate states the semiconductor device before and after mounting the second semiconductor chip 3 on the substrate 1 by using the two-layered mounting-use bonding layer 4.

As showing in FIGS. 6(a) and 6(b), the mounting-use bonding layer 4b associate with the second semiconductor chip 3 is not fully melted into the liquid state in mounting the second semiconductor chip 3 on which the two-layered mounting-use layer 4 is formed. For example, even if the mounting-use bonding layer 4a associated with the substrate 1 is melted into the liquid state by heating, the mounting-use bonding layer 4b associate with the second semiconductor chip 3 is not fully melted into the liquid state. This makes it possible to easily control the thickness of the bonding layer between the first semiconductor chip 2 and the second semiconductor chip 3.

This arrangement solves a problem that it is difficult to control the thickness of the bonding layer between the first semiconductor chip 2 and the second semiconductor chip 3 in case where the second semiconductor chip 3 is mounted while the mounting-use bonding layer 4 is in the liquid state. Therefore, it is possible to easily form a bonding layer having a certain thickness between the first semiconductor chip 2 and the second semiconductor chip 3.

Moreover, in the semiconductor device 10 of the present embodiment is, as in the first embodiment, the mounting-use bonding layer functions as a bonding agent in bonding the second semiconductor chip 3, and as a supporting member for supporting protruded part of the semiconductor chip 3. Because of this, it is possible to stably wire-bond, with the substrate 1, an electrode terminal located on the protruded part of the second semiconductor chip 3. Moreover, this eliminates a need for additional member and step, thereby attaining beneficial effects such as cost reduction.

[Fourth Embodiment]

Described below is yet another embodiment of a semiconductor device of the present invention, referring to FIG. 7. For the sake of easy explanation, members having the same functions as the members described in the first, second, and third embodiments are labeled in the same manner and their explanation is omitted here. In the present embodiment, a difference from the first, second, and third embodiments is explained.

Figure 7:
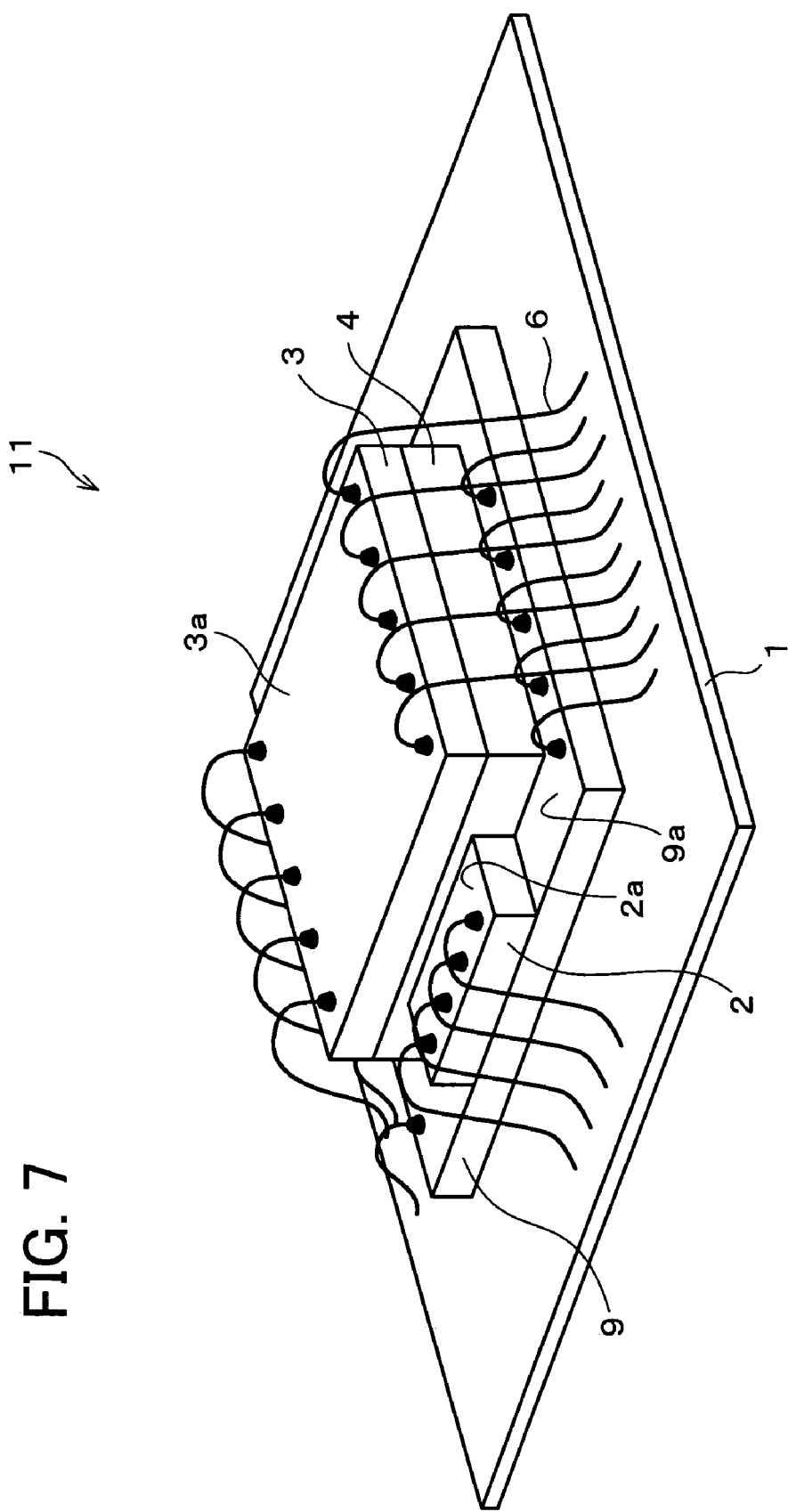
FIG. 7 is a perspective view of a semiconductor device of yet another embodiment of the present invention, having three semiconductor chips layered.
Figure 8:
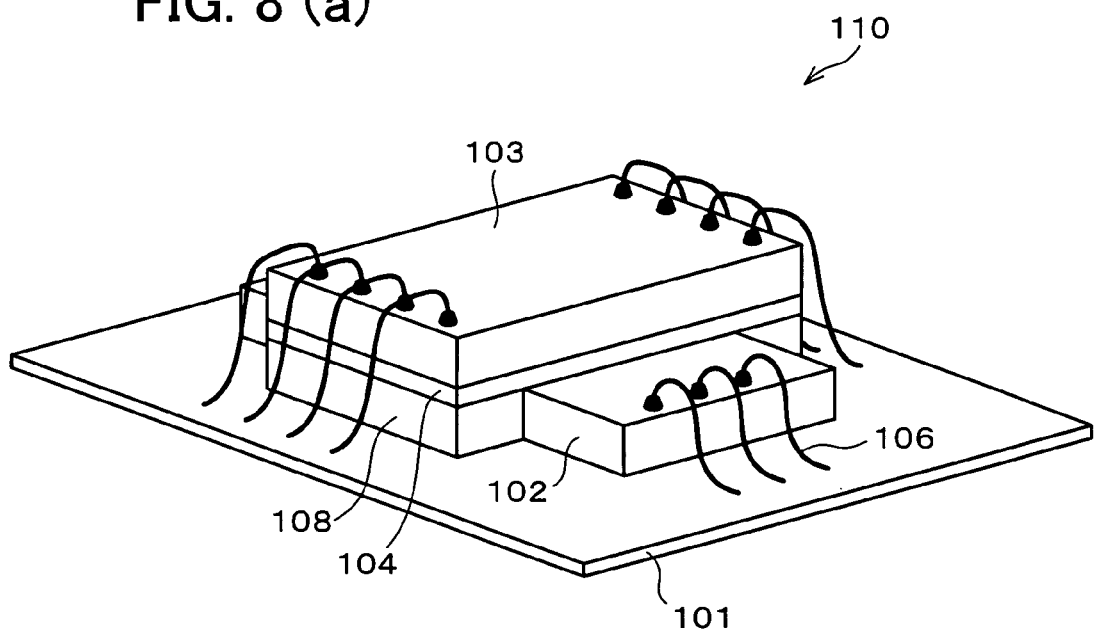
Figure 8:
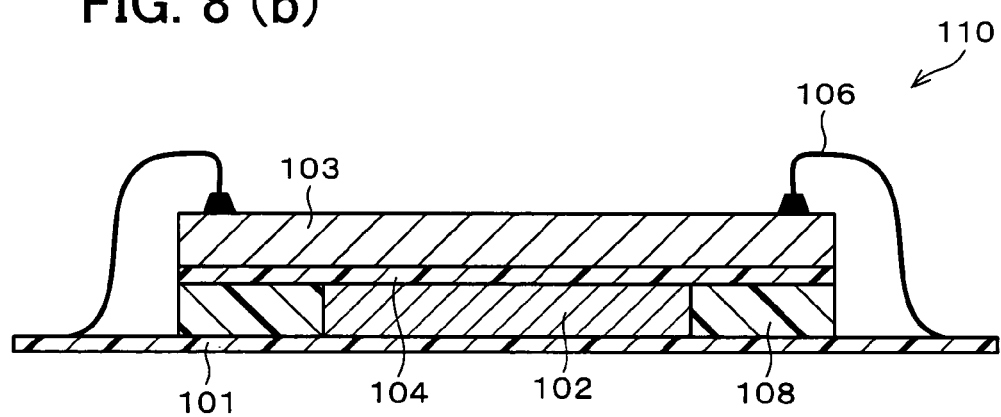

FIG. 7 illustrates a semiconductor 11 of the present embodiment. The semiconductor 11 is provided with three semiconductor chips.

Hereinbefore, the semiconductor devices 10 including the two semiconductor chips are discussed. However, the present invention is also applicable in a semiconductor device in which more than two semiconductor chips are layered, as the semiconductor 11 provided with a substrate 1, a first semiconductor chip 2, a second semiconductor chip 3, a mounting-use bonding layer 4, gold wires 6, and a third semiconductor chip 9. The first semiconductor chip 2, second semiconductor chip 3, mounting-use bonding layer 4, gold wires 6, and third semiconductor chip 9 are located on the substrate 1 as described in FIG. 7.

More specifically, in the semiconductor device 11, the third semiconductor chip 9 is so mounted on the substrate 1 that a reverse surface of the third semiconductor chip 9 with respect to a circuit formation surface 9a faces the substrate 1. Moreover, the first semiconductor chip 2 is so layered on the third semiconductor chip 9 that a reverse surface of the first semiconductor chip 2 with respect to a circuit formation surface 2a faces the circuit formation surface 9a of the third semiconductor chip 9. Further, the second semiconductor chip 3 is layered on the first semiconductor chip 2 in such a manner that (i) a reverse surface of the second semiconductor chip 3 with respect to the circuit formation surface 3a faces the circuit formation surface 2a of the first semiconductor chip 2, and (ii) an outer edge of the second semiconductor chip 3 is protruded from an outer edge of the first semiconductor chip 2.

Moreover, electrode terminals of the first semiconductor chip 2, the second semiconductor chip 3, and the third semiconductor chip 9 are electrically connected with the substrate 1 by wire bonding.

Moreover, the mounting-use bonding layer 4 fills a gap between the third semiconductor chip 9 and protruded part of the second semiconductor chip 3. The mounting-use bonding layer 4 functions as a supporting member for supporting the protruded part of the second semiconductor chip 3.

In the present embodiment, the third semiconductor chip 9 is so mounted on the substrate 1 as to be the so-called face-up. Besides this, the third semiconductor chip 9 may be so mounted on the substrate 1 as to be face-down. Thus, how to mount the third semiconductor chip 9 on the substrate 1 is not particularly limited. Further, the third semiconductor chip 9 may be layered on another semiconductor chip mounted on the substrate 1. Note that, the third semiconductor chip 9 and the substrate 1 are not wired bonded in case where the third semiconductor chip 9 is so mounted on the substrate as to be so called face-down.

Moreover, a thickness of the mounting-use bonding layer 4, which is so located as to be associated with the reverse surface of the second semiconductor chip 3 with respect to the circuit formation surface 3a, is not particularly limited, provided that the thickness is enough (i) to allow the mounting-use bonding layer 4 to surely bond the first semiconductor chip 2 with the second semiconductor chip 3, and (ii) to allow the mounting-use bonding layer 4 to fill a gap between the third semiconductor chip 9 and the protruded part of the second semiconductor chip 3 so that the mounting-use bonding layer 4 functions as a supporting member.

The semiconductor device 11 having the structure discussed above also attains the same advantage as the first embodiment. That is, the mounting-use bonding layer 4 located on the reverse side of the second semiconductor chip 3 with respect to the circuit formation surface 3a functions as a bonding agent in mounting the second semiconductor chip 3, and as a supporting member for supporting the protruded part of the second semiconductor chip 3. Therefore, it is possible to stably wire-bond, with the substrate 1, an electrode terminal provided on the protruded part of the semiconductor chip 3. This realizes good wire bonding even for a semiconductor device in which more than two semiconductor chips are mounted (layered).

Moreover, the semiconductor device of the present invention may be preferably arranged such that a surface of the mounting-use bonding layer has the same shape as the reverse surface of the second semiconductor chip, the surface being in touch with the reverse surface of the second semiconductor chip.

In this arrangement, the second semiconductor chip on which the mounting-use bonding layer is formed, is mounted on the first semiconductor chip, the mounting-use bonding layer having a shape (size) substantially equal to that of the reverse surface of the second semiconductor chip with respect to the circuit formation layer. With this arrangement, it is possible to surely bond the second semiconductor chip with the first semiconductor chip and the circuit substrate in mounting the second semiconductor chip, and to stably support the protruded part of the second semiconductor chip. As a result, it is possible to attain more stable wire bonding to bond the circuit substrate with the electrode terminal provided on the protruded part of the second semiconductor chip.

Moreover, the semiconductor device of the present invention may be preferably arranged such that the mounting-use bonding layer forms, in the gap, a supporting member for supporting the protruded part; and a surface of the supporting member has the same shape (size) as the reverse surface of the protruded part, the surface being in contact with the reverse surface of the protruded part.

With this arrangement, it is possible to more surely and stably support the protruded part of the second semiconductor chip. Therefore, it is possible to attain more stable wire bonding to bond the circuit substrate with the electrode terminal provided on the protruded part of the second semiconductor chip, in the semiconductor device.

Moreover, the semiconductor device of the present invention may be preferably arranged such that the mounting-use bonding layer is made of a thermosetting resin being in a solid state at ordinary temperatures, being melted into a liquid state by heating, and being solidified by heat treatment after being melted.

With this arrangement, the mounting-use bonding layer is easy to handle because the mounting-use bonding layer is in a solid state at ordinary temperatures. Moreover, it is easy to fill the mounting-use bonding layer into the gap between the circuit substrate and the protruded part of the second semiconductor chip, because the mounting-use bonding layer is melted into a liquid state by heating. Further, the mounting-use bonding layer is solidified by heat treatment after being melt. Because of this, the second semiconductor chip is perfectly bonded with the protruded part thereof surely supported.

Moreover, the semiconductor device may be preferably arranged such that the mounting-use bonding layer is made of an epoxy resin Furthermore, the semiconductor device of the present invention may be preferably arranged such that the mounting-use bonding layer includes two layers, one of which is associated with the second semiconductor chip and is less meltable into a liquid state than the other one of the two layers, which is associated with the first semiconductor chip.

In this arrangement, the mounting-use bonding layer includes two layers, one of which is associated with the second semiconductor chip and is less meltable into a liquid state than the other one of the two layers, which is associated with the first semiconductor chip.

That is, for example, the bonding layer associated with the second semiconductor chip is not fully melted into a liquid state, even if part of the mounting-use bonding layer (mainly the bonding layer associated with the circuit substrate) is melted into a liquid state in mounting the second semiconductor chip. This attains easy control of the thickness of the bonding layer between the first semiconductor chip and the second semiconductor chip. Thus, it is possible to form a layer having a certain thickness between the first semiconductor chip and the second semiconductor chip, and to surely layer the second semiconductor chip and stably mount the second semiconductor chip on the circuit substrate.

Moreover, the semiconductor device of the present invention may be preferably arranged such that the mounting-use bonding layer is made of a liquid resin.

With this arrangement, in which the mounting-use bonding layer is made of the liquid resin, the liquid resin functions as the bonding agent in mounting the second semiconductor chip. Further it is easy to fill the liquid resin into the gap between the second semiconductor chip and the circuit substrate. Thus, it is possible to form a supporting member capable of surely supporting the protruded part of the second semiconductor chip.

According to the semiconductor device of the present invention, as described above, it is possible to attain stable wire bonding to bond the circuit substrate with the electrode terminal provided on the protruded part of the second semiconductor chip, even in such semiconductor device in which the second semiconductor chip is mounted (layered) on the first semiconductor chip mounted as being so-called face-up type. With this arrangement, it is possible to easily provide, by good wire bonding, a semiconductor device of high quality.

Moreover, according to the semiconductor device of the present invention, it is possible to attain stable wire bonding to bond the circuit substrate with the electrode terminal provided on the protruded part of the second semiconductor chip, even in such semiconductor device in which the second semiconductor chip is mounted (layered) on the first semiconductor chip mounted as being so-called face-down type. With this arrangement, it is possible to easily provide, by good wire bonding, a semiconductor device of high quality.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed:
1. A semiconductor device comprising:
   a plurality of semiconductor chips layered on a circuit substrate, wherein:
   at least two semiconductor chips are respectively a first semiconductor chip, and a second semiconductor chip, each of which has a circuit formation surface and a reverse surface with respect to the circuit formation surface,
   the first semiconductor chip being mounted on the circuit substrate in such a manner that the reverse surface of the first semiconductor chip faces the circuit substrate,
   the second semiconductor chip (i) being mounted on the first semiconductor chip in such a manner that the reverse surface of the second semiconductor chip faces the circuit formation surface of the first semiconductor chip, and (ii) having protruded part formed by protruding at least one outer edge of the second semiconductor chip from an outer edge of the first semiconductor chip as viewed from above,
   the first semiconductor chip and the second semiconductor chip being wire-bonded with the circuit substrate;

the semiconductor device comprising a mounting-use bonding layer on the reverse surface of the second semiconductor chip, the mounting-use bonding layer functioning as a bonding agent for mounting the second semiconductor chip on the first semiconductor chip, and filling a gap between (i) the circuit substrate and (ii) the protruded part of second semiconductor chip; and wherein a surface of the mounting-use bonding layer has the same shape as the reverse surface of the second semiconductor chip, the surface being in touch with the reverse surface of the second semiconductor chip.

2. The semiconductor device as set forth in claim 1, wherein:

the mounting-use bonding layer forms, in the gap, a supporting member for supporting the protruded part; and a surface of the supporting member has the same shape as the reverse surface of the protruded part, the surface being in contact with the reverse surface of the protruded part.

3. The semiconductor device as set forth in claim 1, wherein:

the mounting-use bonding layer is made of a thermosetting resin being in a solid state at ordinary temperatures, being melted into a liquid state by heating, and being solidified by heat treatment after being melted.

4. The semiconductor device as set forth in claim 1, wherein: the mounting-use bonding layer is made of an epoxy resin.

5. The semiconductor device as set forth in claim 1 wherein: the mounting-use bonding layer includes two layers, one of which is associated with the second semiconductor chip and is less meltable into a liquid state than the other one of the two layers, which is associated with the first semiconductor chip.

6. The semiconductor device as set forth in claim 1, wherein: the mounting-use bonding layer is made of a liquid resin.

7. The semiconductor device of claim 1, wherein a third semiconductor chip is provided between the substrate and the first semiconductor chip.

* * * * *